United States Patent

Kimura

[11] Patent Number: 5,999,055
[45] Date of Patent: Dec. 7, 1999

[54] TUNABLE CMOS OPERATIONAL TRANSCONDUCTANCE AMPLIFIER

[75] Inventor: Katsuji Kimura, Tokyo, Japan

[73] Assignee: NEC Corporation, Tokyo, Japan

[21] Appl. No.: 09/132,738

[22] Filed: Aug. 12, 1998

[30] Foreign Application Priority Data

Aug. 12, 1997 [JP] Japan ................................ 9-217665

[51] Int. Cl.$^6$ .................................................. H03F 3/45
[52] U.S. Cl. ........................ 330/255; 330/253; 330/257
[58] Field of Search .................................. 330/253, 255, 330/257, 252, 261

[56] References Cited

U.S. PATENT DOCUMENTS

| 4,749,957 | 6/1988 | Tsividis | 330/253 |
| 5,774,020 | 6/1998 | Kimura | 330/253 |
| 5,896,063 | 4/1999 | Marsh et al. | 330/254 |

FOREIGN PATENT DOCUMENTS

| 0 534 007 | 3/1993 | European Pat. Off. |
| 62-144412 | 6/1987 | Japan . |
| 5-20413 | 3/1993 | Japan . |
| 5-191166 | 7/1993 | Japan . |
| 7-79121 | 3/1995 | Japan . |
| 7-336164 | 12/1995 | Japan . |
| 8-84029 | 3/1996 | Japan . |

*Primary Examiner*—Robert Pascal
*Assistant Examiner*—Khanh Van Nguyen
*Attorney, Agent, or Firm*—Sughrue, Mion, Zinn, Macpeak & Seas, PLLC

[57] ABSTRACT

A tunable CMOS OTA is provided, which improves the transconductance linearity with a simple circuit configuration. This OTA is comprised of (a) a differential input pair of first and second MOSFETs, (b) a first resistor connected to sources of the first and second MOSFETs, (c) a current source/sink for supplying/sinking a variable driving current to the differential input pair, and (d) an output circuit for the differential input pair. A differential input voltage is applied across gates of the first and second MOSFETs to generate a first pair of differential output currents. The current flowing through the first resistor is proportional to the applied differential input voltage. The first pair of differential output currents are applied to drains of third and fourth MOSFETs of the output circuit, respectively, thereby generating a first bias voltage at the drain of the third MOSFET and a second bias voltage at the drain of the fourth MOSFET. The first and second bias voltages generate a current flowing through the second and third resistors, which is proportional to the applied differential input voltage. A differential output current of the OTA is derived from the difference between the second pair of differential output currents flowing through the third and fourth MOSFETs of the output circuit, respectively.

7 Claims, 5 Drawing Sheets

$\Delta I = I_{D6} - I_{D5}$

TUNABLE CMOS OPERATIONAL TRANSCONDUCTANCE AMPLIFIER

BACKGROUND OF THE INVENTION

1. Field of the Invention

The present invention relates to an Operational Transconductance Amplifier (OTA) comprised of Metal-Oxide-Semiconductor Field-Effect Transistors (MOSFETS) and more particularly, to a tunable OTA capable of tuning its transconductance and having the Complementary MOS (CMOS) structure, which is preferably formed on a CMOS semiconductor integrated circuit (IC).

2. Description of the Prior Art

A differential amplifier circuit having an improved transconductance linearity within a comparatively wide input voltage range has been known as an "OTA". When the transconductance is changeable, the OTA has been termed a "tunable OTA".

An example of the conventional tunable CMOS OTAs is shown in FIG. 1, in which a MOSFET is used as a common source resistor for a source-coupled differential pair of MOSFETs. This example is disclosed in the U.S. Pat. No. 5,451,901 issued in 1995.

As shown in FIG. 1, two n-channel MOSFETs M137 and M138 constitute a balanced, input differential pair of this OTA, in which gates of the MOSFETs M137 and M138 are applied with two input signals inp and inm through lines 179 and 174, respectively. Thus, a differential input signal (inm-inp) is applied across the gates of the MOSFETs M137 and M138.

Sources of the MOSFETs M137 and M138 are coupled together through an n-channel MOSFET M143 serving as a variable resistor. The sources of the MOSFETs M137 and M138 are connected to a source and a drain of the MOSFET M143 at nodes 186 and 188, respectively. A gate of the MOSFET M143 is applied with a control signal con through a line 175, so that the source-to-drain resistance of the MOSFET M143 is changed or controlled by the control signal con.

Three p-channel MOSFETs M131, M132, and M133 whose sources are coupled together and whose gates are coupled together constitute constant current sources for driving the MOSFETs M134, M137 and M138, respectively. Three n-channel MOSFETs M134, M135, and M136 constitute current mirror circuits; the MOSFETs M135 and M136 constitute constant current sources for driving the MOSFETs M142 and M141, respectively.

A bias signal pb is commonly applied to the coupled gates of the MOSFETs M131, M132, and M133 through a line 170, thereby supplying the same constant driving currents $I_0$ to the MOSFETs M137 and M138 of the input differential pair, respectively.

Two p-channel MOSFETs M144 and M145 constitute a power down circuit for the MOSFETs M137 and M138 of the input differential pair. Sources of the MOSFETs M144 and M145 are coupled together to be connected to the sources of the MOSFETs M131, M132, and M133. Gates of the MOSFETs M144 and M145 are commonly applied with a power down signal pd through a line 176. Drains of the MOSFETs M144 and M145 are connected to drains of the MOSFETs M141 and M142, respectively. Gates of the MOSFETs M141 and 142 are connected to the drains of the MOSFETs M137 and M138 of the input differential pair, respectively.

Two output signals outp and outm are derived through the gates of the MOSFETs M139 and M140, respectively.

(N+1) n-channel MOSFETs M139 and M146(1) to M146(n) whose sources are coupled together and whose gates are coupled together constitute an output circuit for the MOSFET M139. The same n output currents 179(1) to 179(n) are derived from the drains of the M146(1) to M146(n), respectively.

Similarly, (n+1) n-channel MOSFETs M140 and M147(1) to M147(n) whose sources are coupled together and whose gates are coupled together constitute another output circuit for the MOSFET M140. The same n output currents 181(1) to 181(n) are derived from the drains of the M147(1) to M147(n), respectively.

In the conventional tunable CMOS OTA shown in FIG. 1, the MOSFET M143 provided between the sources of the input-pair MOSFETs M137 and M138 serves as a source-degeneration resistor for the input differential pair. Therefore, the transconductance of this OTA is able to be changed by changing the source-to-drain resistance of the MOSFET 143 using the control signal con applied to its gate.

Next, the operation principle of the conventional tunable CMOS OTA shown in FIG. 1 is explained below.

The currents flowing through the input-pair MOSFETs M137 and M138, which are produced by the constant current source formed by the MOSFETs M132 and M133, are equal to $I_0$. Therefore, the input-pair MOSFETs M137 and M138 are driven by the same constant currents $I_0$, respectively. Thus, the following equation (1) is established $$V_{GS137} = V_{GS138} \tag{1}$$

where $V_{GS137}$ and $V_{GS138}$ are gate-to-source voltages of the MOSESTs M137 and M138, respectively.

Therefore, if the differential input signal (inm-inp) is defined as a differential voltage $V_i$, the differential input voltage $V_i$ is level-shifted without any change and is applied across the source and drain of the MOSFET M143. In other words, the differential input voltage $V_i$ is directly applied across the source and drain of the MOSFET M143.

Thus, drain currents $I_{D139}$ and $I_{D140}$ of the MOSFETs M139 and M140 are expressed as the following equations (2a) and (2b) using the driving current $I_0$ and a drain current $I_{D143}$ of the MOSFET M143.

$$I_{D139} = I_0 + I_{D143} \tag{2a}$$

$$I_{D140} = I_0 - I_{D143} \tag{2b}$$

As clearly seen from FIG. 1, a gate-to-source voltage of the MOSFET 139 is equal to gate-to-source voltages of the MOSFETs M146(1) to M146(n). Similarly, a gate-to-source voltage of the MOSFET 140 is equal to gate-to-source voltages of the MOSFETs M147(1) to M147(n) Therefore, the following equations (3a) and (3b) are established $$I_{D139} = I_{D146} = I_0 + I_{D143} \tag{3a}$$

$$I_{D140} = I_{D147} = I_0 - I_{D143} \tag{3b}$$

where $I_{D146}$ denotes the output currents 179(1) to 179(n) outputted from the MOSFETs M146(1) to M146(n), and $I_{D147}$ denotes the output currents 181(1) to 181(n) outputted from the MOSFETs M147(1) to M147(n).

Since the transconductance of the conventional CMOS OTA shown in FIG. 1 is expressed as $(I_{D146}/V_i)$ or $(I_{D147}/V_i)$, it is seen from the equations (3a) and (3b) that the transconductance is determined by the drain current $I_{D143}$ of the MOSFET M143. The drain current $I_{D143}$ of the MOS- FET M143 is changeable by changing the source-to-drain resistance (i.e., equivalent resistance) of the MOSFET M143, which is changed by a tuning voltage $V_{con}$ applied to the gate of the MOSFET M143 as the control signal con.

Accordingly, the transconductance of the conventional CMOS OTA shown in FIG. 1 is tunable by changing the equivalent resistance of the MOSFET M143 using the tuning voltage $V_{con}$.

The MOSFET M143 serving as the equivalent resistor is operating in the linear or triode region. Therefore, supposing that the channel-length modulation and the body effect can be ignored, the drain current $I_{D143}$ of the MOSFET M143 is given by the following well-known expression (4a).

$$I_{D143} = 2\beta\left(V_{GS143} - V_{TH} - \frac{V_{DS143}}{2}\right)V_{DS143} \quad (4a)$$

In the expression (4a), $V_{DS143}$ is the source-to-drain voltage of the MOSFET M143, $V_{GS143}$ is the gate-to-source voltage thereof, $V_{TH}$ is the threshold voltage thereof, and $\beta$ is the transconductance parameter thereof.

The transconductance parameter $\beta$ is defined as $$\beta = \frac{\mu C_{ox}}{2} \cdot \frac{W}{L}$$

where $\mu$ is the mobility of a carrier, $C_{ox}$ is the gate-oxide capacitance per unit area, and W and L are a gate width and a gate length of each MOSFET, respectively.

As described above, the source-to-drain voltage $V_{DS143}$ of the MOSFET M143 is equal to the differential input voltage $V_i$. Thus, the following equation (4b) is established.

$$V_{DS143} = V_i \quad (4b)$$

Also, supposing that the differential input voltage V is generated by two input voltages $[(V_i/2)+V_R]$ and $[(V_i/2)-V_R]$ using a reference voltage $V_R$, the gate-to-source voltage $V_{GS143}$ of the MOSFET M143 is expressed as the following equation (4c).

$$I_{GS143} = V_{con} - V_R - V_{GS138} - \frac{|V_i|}{2} \quad (4c)$$

By substituting the equations (4b) and (4c) into the equation (4a), the drain current $I_{D143}$ of the MOSFET M143 is given by the following equation (5).

$$I_{D143} = 2\beta\left(V_{con} - V_R - V_{GS138} - \frac{|V_i|}{2} - V_{TH} - \frac{|V_i|}{2}\right)|V_i|$$
$$= 2\beta(V_{con} - V_R - V_{GS138} - V_{TH})|V_i| - 2\beta|V_i|^2 \quad (5)$$

In the equation (5), although the term $2\beta(V_{con}-V_{GS138}-V_{TH})|V_i|$ is a linear term with respect to the amplitude of the differential input voltage $V_i$, i.e., $|V_i|$, the term $[2\beta|V_i|^2]$ is a nonlinear term with respect to $|V_i|$. If the amplitude $|V_i|$ of the differential input voltage becomes large, the effect of the nonlinear term will be unable to be ignored, resulting in degradation of the transconductance linearity of the conventional tunable CMOS OTA shown in FIG. 1.

As explained above, with the conventional tunable CMOS OTA shown in FIG. 1, the linearity of the transfer characteristic of the differential input pair of the MOSFETs M141 and M142 is badly affected by the nonlinear resistance of the MOSFET M143 serving as the source-degeneration resistor. Consequently, the transconductance linearity is not satisfactory.

OTAs are essential functional blocks in analog signal processing. In recent years, the need for tunable OTAs capable of tuning the linear transconductance has been becoming stronger and stronger.

SUMMARY OF THE INVENTION

Accordingly, an object of the present invention is to provide a tunable CMOS OTA that improves the transconductance linearity with a simple circuit configuration.

Another object of the present invention is to provide a tunable CMOS OTA that cancels the temperature dependence due to resistors.

Still another object of the present invention is to provide a tunable CMOS OTA that possesses the improved temperature characteristic.

The above objects together with others not specifically mentioned will become clear to those skilled in the art from the following description.

A tunable CMOS OTA according to the present invention is comprised of (a) a differential input pair of first and second MOSFETs, (b) a first resistor connected to sources of the first and second MOSFETs, (c) a current source/sink for supplying/sinking a variable driving current to the differential input pair, and (d) an output circuit for the differential input pair.

A differential input voltage is applied across gates of the first and second MOSFETs to generate a first pair of differential output currents. One of the first pair of differential output currents includes a sum of the driving current and a current flowing through the first resistor. The other of the first pair of differential output currents includes a difference of the driving current and the current flowing through the first resistor. The current flowing through the first resistor is linearly proportional to the applied differential input voltage.

The output circuit includes third and fourth MOSFETs whose gates are coupled together to be connected to a connection point, a second resistor connected to a drain of the third MOSFET and the connection point, a third resistor connected to a drain of the fourth MOSFET and the connection point, a fifth MOSFET whose gate is connected to the drain of the third MOSFET, and a sixth MOSFET whose gate is connected to the drain of the fourth MOSFET.

The first pair of differential output currents of the differential input pair are applied to the drains of the third and fourth MOSFETs, respectively, thereby generating a first bias voltage at the drain of the third MOSFET and a second bias voltage at the drain of the fourth MOSFET.

The first and second bias voltages generate a current flowing through the second and third resistors and a second pair of differential output currents flowing through the fifth and sixth MOSFETs, respectively. The current flowing through the second and third resistors is linearly proportional to the applied differential input voltage.

A differential output current of the OTA is derived from a difference between the second pair of differential output currents.

A transconductance of the OTA is tunable by changing the driving current supplied/sunk by the current source/sink.

With the tunable CMOS OTA according to the present invention, when the differential input voltage is applied across the gates of the first and second MOSFETs of the differential input pair, the first pair of differential output currents are generated. One of the first pair of differential output currents includes the sum of the driving current and the current flowing through the first resistor. The other of the first pair of differential output currents includes the difference of the driving current and the current flowing through the first resistor. The current flowing through the first resistor is linearly proportional to the applied differential input voltage.

Then, the first pair of differential output currents of the differential input pair are applied to the drains of the third and fourth MOSFETs of the output circuit, respectively, thereby generating the first bias voltage at the drain of the third MOSFET and the second bias voltage at the drain of the fourth MOSFET.

Therefore, each of the first and second bias voltages is proportional to the driving current for the differential input pair.

Since the first and second bias voltages generate the second pair of differential output currents flowing through the fifth and sixth MOSFETs, respectively, the second pair of differential output currents are proportional to the driving current for the differential input pair.

Consequently, the differential output current of the OTA, which is equal to the difference between the second pair of differential output currents, is linearly proportional to the differential input voltage and is proportional to the driving current for the differential input pair.

As described above, the transconductance is tunable by changing the driving current for the differential input pair, which is realized without using any nonlinear components. Thus, the transconductance linearity of the tunable OTA is improved.

Moreover, the tunable CMOS OTA according to the present invention is comprised of the differential input pair, the first resistor, the current source/sink for the differential input pair, and the put circuit alone. Therefore, this OTA has a simple circuit configuration.

Additionally, the differential input pair of the first and second MOSFETs converts the applied differential input voltage to the current flowing through the first resistor and then, generates the first pair of differential output currents each of which includes the current flowing through the first resistor. The output circuit generates the first and second bias voltages from the first pair of differential output currents, thereby generating the current flowing through the second and third resistors linearly proportional to the applied differential input voltage.

Accordingly, the differential output current of the OTA according to the present invention includes no resistance dimension of the first to third resistors, which results in the fact that this tunable OTA has no temperature dependence due to the first to third resistors. This means that the temperature characteristic or temperature dependence itself is improved.

In a preferred embodiment of the OTA according to the present invention, a current mirror circuit is additionally provided between the differential input pair and the output circuit. The first pair of output currents of the differential input pair are applied to the output circuit through the current mirror circuit.

It is preferred that the current mirror circuit is a source-follower-augmented current mirror circuit.

In another preferred embodiment of the OTA according to the present invention, the current source/sink for supplying/sinking the variable driving current to the differential input pair is formed by a current reference circuit capable of generation of a variable reference current including no transconductance parameter.

In this case, there is an additional advantage that the temperature dependence of the differential output current of the OTA is lowered to approximately zero.

In still another preferred embodiment of the OTA according to the present invention, the output circuit includes a current mirror circuit. The second pair of differential output currents are derived through the current mirror circuit, thereby generating the differential output current of the OTA.

In a further preferred embodiment of the OTA according to the present invention, the first and second MOSFETs have a first conductivity type and the third to sixth MOSFETs have a second conductivity type opposite to the first conductivity type. The differential input pair and the output circuit are connected in parallel.

In a still further preferred embodiment of the OTA according to the present invention, the first to sixth MOSFETs have a same conductivity type. The differential input pair and the output circuit are connected in series.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
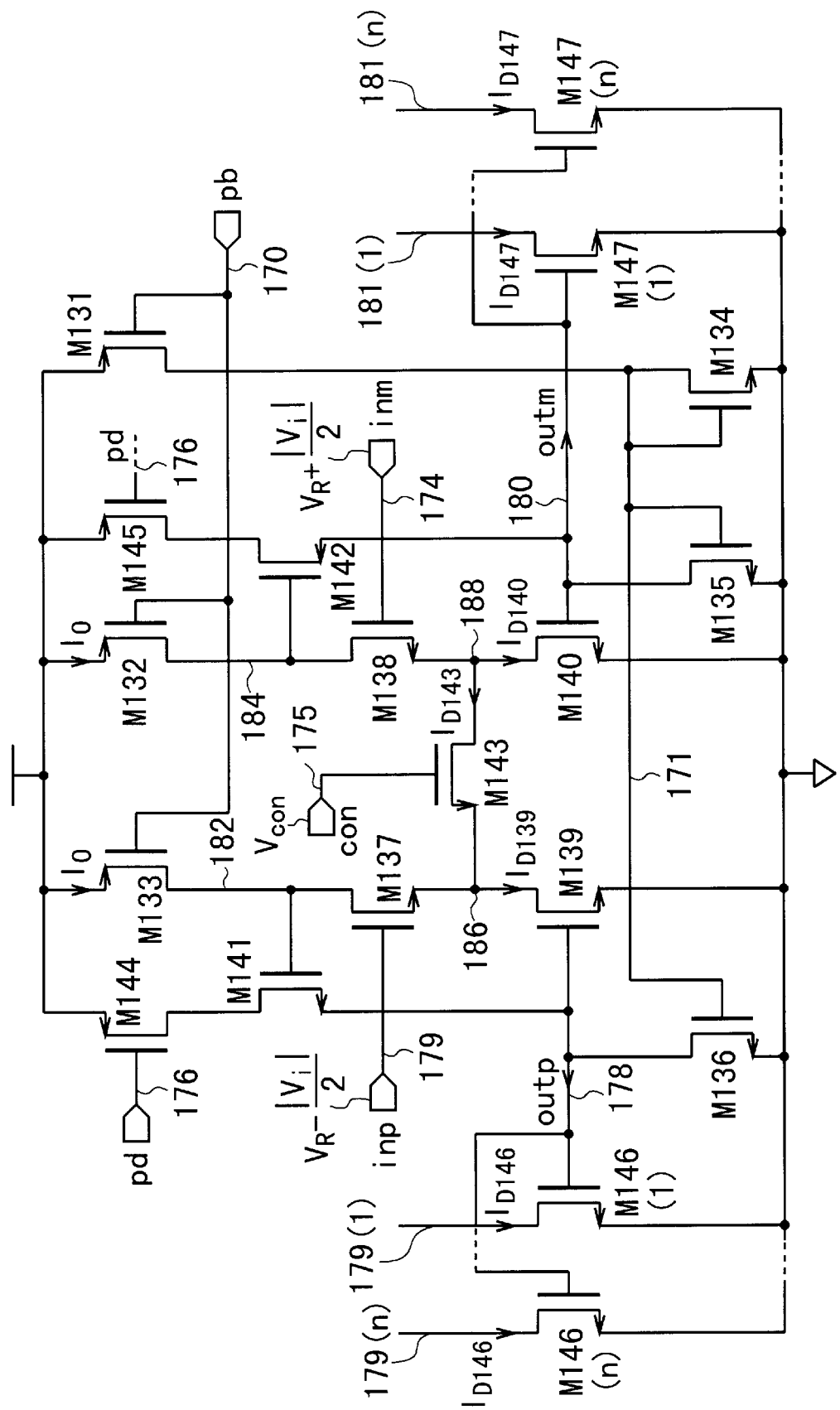
FIG. 1 is a circuit diagram of a conventional tunable CMOS OTA.

Preferred embodiments of the present invention will be described in detail below while referring to the drawings attached.

FIRST EMBODIMENT

Figure 2:
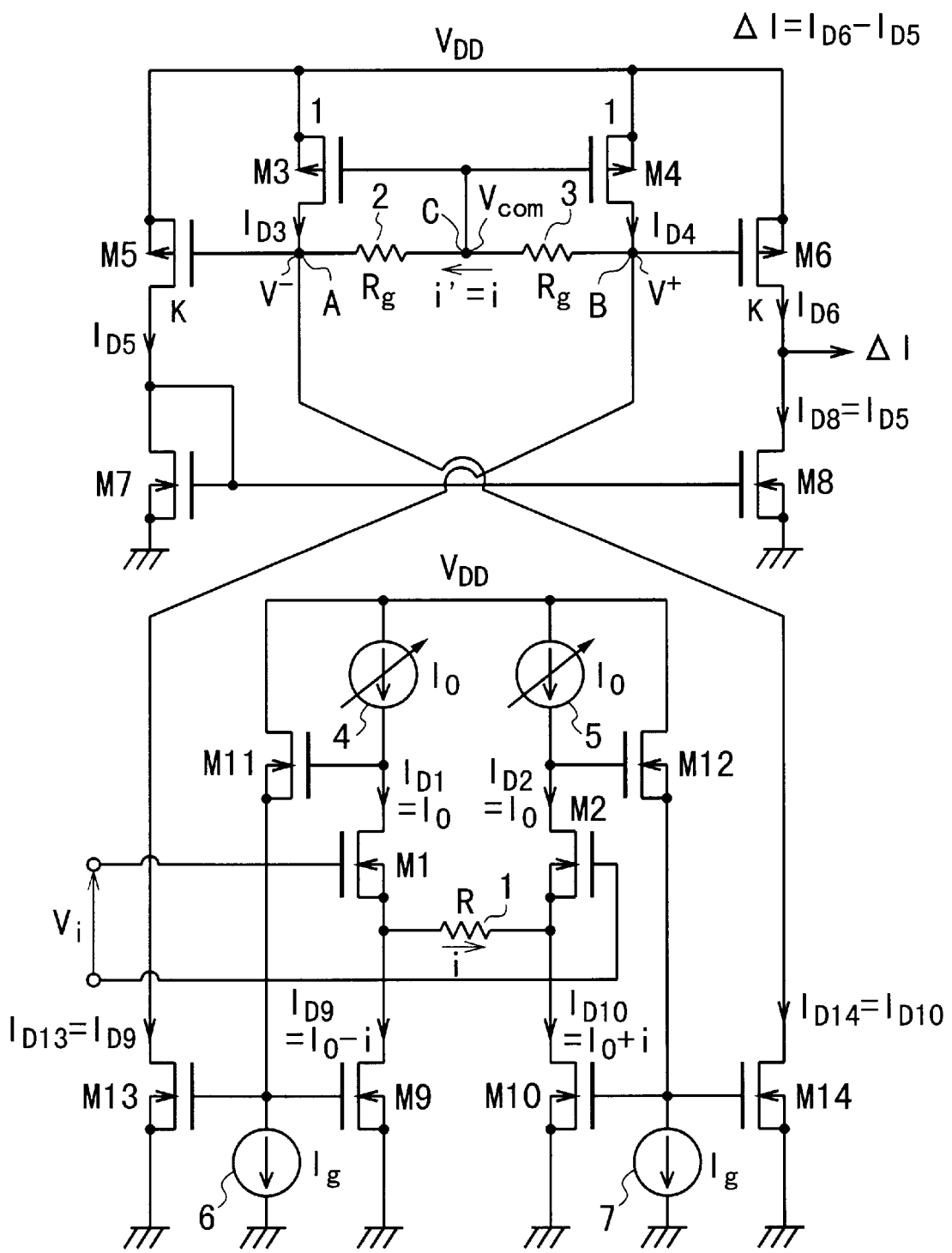
FIG. 2 is a circuit diagram of a tunable CMOS OTA according to a first embodiment of the present invention.

Referring to FIG. 2, a tunable CMOS OTA according to a first embodiment of the present invention is comprised of a V-I converter circuit, first and second source-follower-augmented current mirror circuits, and an output circuit.

The V-I converter circuit includes a differential pair formed by n-channel MOSFETs M1 and M2 and a resistor 1 with a resistance R connected to sources of the MOSFETs M1 and M2. A differential input voltage $V_i$ is applied across gates of the MOSFETs M1 and M2.

A current source 4 supplying a variable current $I_0$ is connected to a drain of the MOSFET M1 and a power supply line supplied with a voltage $V_{DD}$, thereby driving the MOSFET M1. Another current source 5 supplying a same variable current $I_0$ is connected to a drain of the MOSFET M2 and the power supply line of $V_{DD}$, thereby driving the MOSFET M2.

The first source-follower-augmented current mirror circuit has three n-channel MOSFETs M9, M11, and M13 and a constant current sink 6 sinking a constant current $I_g$.

Gates of the MOSFETs M9 and M13 are coupled together to be connected through the constant current sink 6 to the ground. A source of the MOSFET M9 is connected to the ground. A drain of the MOSFET X9 is connected to a source of the MOSFET M1. A source of the MOSFET M1 is connected through the constant current sink 6 to the ground. A gate of the MOSFET M 11 is connected to the drain of the MOSFET M1. A drain of the MOSFET M11 is connected to the power supply line of $V_{DD}$. A source of the MOSFET M13 is connected to the ground. A drain of the MOSFET M13 is connected to a first input terminal of the output circuit.

The first source-follower-augmented current mirror circuit serves to input one of a pair of differential output currents of the input differential pair of the MOSFETs M1 and M2 into the output circuit.

Similarly, the second source-follower-augmented current mirror circuit has three n-channel MOSFETs M10, M12, and M14 and a constant current sink 7 sinking a same constant current $I_g$ as that of the constant current sink 6.

Gates of the MOSFETs M10 and M14 are coupled together to be connected through the constant current sink 7 to the ground. A source of the MOSFET M10 is connected to the ground. A drain of the MOSFET M10 is connected to a source of the MOSFET M2. A source of the MOSFET M12 is connected through the constant current sink 7 to the ground. A gate of the MOSFET M 12 is connected to the drain of the MOSFET M2. A drain of the MOSFET M12 is connected to the power supply line of $V_{DD}$. A source of the MOSFET M14 is connected to the ground. A drain of the MOSFET M14 is connected to a second input terminal of the output circuit.

The second source-follower-augmented current mirror circuit serves to input the other of the pair of differential output currents of the input differential pair of the MOSFETs M1 and M2 into the output circuit.

The output circuit includes a differential active load formed by four p-channel MOSFETs M3, M4, M5, and M6, and two resistors 2 and 3 with a same resistance $R_g$. The output circuit further includes a current mirror circuit formed by two n-channel MOSFETs M7 and M8.

In the differential active load, sources of the MOSFETs M3 and M4 are connected to the power supply line of $V_{DD}$. Gates of the MOSFETs M3 and M4 are coupled together to be connected to one terminal of the resistor 2 and one terminal of the resistor 3 at a point C. A drain of the MOSFET M3 is connected to another terminal of the resistor 2, a gate of the MOSFET M5, and the drain of the MOSFET M14 at a point A. A drain of the MOSFET M4 is connected to another terminal of the resistor 3, a gate of the MOSFET M6, and the drain of the MOSFET M13 at a point B. Thus, the resistor 2 is connected to the points A and C, and the resistor 3 is connected to the points B and C. The point B serves as the first input terminal of the output circuit and the point C serves as the second input terminal thereof.

A source of the MOSFET M5 is connected to the power supply line of $V_{DD}$. A drain of the MOSFET M5 is connected to a drain and a gate of the MOSFET M7. A source of the MOSFET M6 is connected to the power supply line of $V_{DD}$. A drain of the MOSFET M6 is connected to a drain of the MOSFET M8. Sources of the MOSFETs M7 and M8 are connected to the ground.

The p-channel MOSFETs M3 and M4 have the same gate-width to gate-length ratio (W/L). The p-channel MOSFETs M5 and M6 have the ratio (W/L) K times as large as that of the MOSFETs M3 and M4, where K is a constant greater than unity (i.e., K>1). The n-channel MOSFETs M7 and M8 have the same gate-width to gate-length ratio (W/L).

The n-channel MOSFETs M1 and M2 forming the differential input pair have the same gate-width to gate-length ratio (W/L).

The n-channel MOSFETs M9, M10, M11, M12, M13, and M14 forming the first and second source-follower-augmented current mirror circuits have the same gate-width to gate-length ratio (W/L).

Next, the operation principle of the tunable CMOS OTA according to the first embodiment in FIG. 2 is explained below.

In general, a drain current $I_{Dj}$ of a j-th MOSFET operating in the saturation region is given by the following well-known expression (6), $$I_{Dj} = K_j(V_{GSj} - V_{TH})^2 \quad (V_{GSj} \geq V_{TH}) \tag{6}$$

where $K_j$ is a dimensional ratio of the j-th MOSFET with respect to a unit MOSFET, $V_{GSj}$ is a gate-to-source voltage of the j-th MOSFET, and $V_{TH}$ is the threshold voltage of each MOSFET.

The MOSFETs M1 and M2 forming the balanced differential input pair are driven by the same driving currents $I_0$, respectively, and the source-degeneration resistor 1 with the resistance R is connected to the sources of the MOSFETs M1 and M2. Therefore, the following equation (7) is established.

$$V_{GS1} = V_{GS2} \tag{7}$$

It is seen from the equation (7) that the differential input voltage $V_i$ applied across the gates of the MOSFETs M1 and M2 is level-shifted and is applied across the both terminals of the resistor 1.

If a current flowing through the resistor 1 is defined as i, the current i is expressed as the following equation (8).

$$i = \frac{V_i}{R} \tag{8}$$

It is seen from the equation (8) that the current i is inversely proportional to the resistance R of the resistor 1 and proportional to the differential input voltage $V_i$. Since a resistor maybe thought generally as a linear element, the current i is linearly proportional to the differential input voltage $V_i$.

If drain currents of the MOSFETs M9 and M10 are defined as $I_{D9}$ and $I_{D10}$, respectively, $I_{D9}$ and $I_{D10}$ are expressed as $I_{D9} = I_0 - i$, and $I_{D10} = I_0 + i$.

On the other hand, gate-to-source voltages of the MOSFETs M13 and M9 are equal, and gate-to-source voltages of the MOSFETs M14 and M10 are equal. Therefore, the following equations (9) and (10) are established.

$$I_{D9} = I_{D13} = I_0 - i \tag{9}$$

$$I_{D10} = I_{D14} = I_0 + i \tag{10}$$

It is seen from the equations (9) and (10) that the transconductance of the differential input pair is determined by the resistance R of the source-degeneration resistor 1, and that the transconductance is kept unchanged even if the driving currents $I_0$ are varied. The transconductance becomes variable with the use of the output circuit in the following way.

In the output circuit, the MOSFETs M3 and M4 serves to apply bias voltages to the MOSFETs M5 and M6, and the MOSFETs M5 and M6 serves as an output pair. The resistors 2 and 3 serve to produce same gate-to-source voltages $V_{GS3}$ and $V_{GS4}$ of the MOSFETs M3 and M4, thereby generating equal drain currents $I_{D3}$ and $I_{D4}$ flowing through the MOSFETs M3 and M4, respectively. The MOSFETs M7 and M8, which form the current mirror circuit, serve to produce a differential output current $\Delta I$ of this CMOS OTA at the drain of the MOSFET ME, where $\Delta I$ is defined as the difference between drain currents $I_{D5}$ and $I_{D6}$ of the MOSFETs M5 and M6 (i.e., $\Delta I = I_{D6} - I_{D5}$).

Therefore, if a current flowing through the resistors 2 and 3 is defined as i', the following equations (11a) and (11b) are established.

$$I_{D3} = I_{D14} - i' = I_0 - i' \quad (11a)$$

$$I_{D4} = I_{D13} - i = I_0 + i' \quad (11b)$$

Since the coupled gates of the MOSFETs M3 and M4 are commonly applied with a voltage $V_{com}$, the gate-to-source voltages $V_{GS3}$ and $V_{GS4}$ of the MOSFETs M3 and M4 are expressed as the following equation (12).

$$V_{GS3} = V_{GS4} = V_{com} \quad (12)$$

This means that the drain currents $I_{D3}$ and $I_{D4}$ of the MOSFETs M3 and M4 are equal; i.e., $$I_{D3} I_{D4} \quad (13)$$

In the equation (12), the voltage $V_{com}$ at the point C has the following relationship (14) with the voltages $V^+$ and $V^-$ at the points B and A.

$$V_{con} = \frac{1}{2}(V^+ + V^-) \quad (14)$$

Then, substituting the equation (13) into the equations (11a) and (11b) gives the following equation (15).

$$i' = i \quad (15)$$

As a result, the following equation (16) is given from the equations (11a) and (11b).

$$I_{D3} = I_{D4} = I_0 \quad (16)$$

Thus, it is found that the drain currents $I_{D3}$ and $I_{D4}$ of the MOSFETs M3 and M4 are equal to the driving currents $I_0$ of the MOSFETs M1 and M2 and that the current i' flowing through the resistors 2 and 3 is equal to the current i flowing through the source-degeneration resistor 1.

On the other hand, the following equations (17), (18), (19), (20), and (21) are established.

$$I_{D3} = I_{D4} = \beta(V_{com} - V_{TH})^2 = I_0 \quad (18)$$

$$I_{D6} = K\beta(V^+ - V_{TH})^2 \quad (18)$$

$$I_{D5} = K\beta(V^- - V_{TH})^2 \quad (19)$$

$$V^+ = V_{com} + R_g \cdot i \quad (20)$$

$$V^- = V_{com} - R_g \cdot i \quad (21)$$

Accordingly, the differential output current $\Delta I$ of the CMOS OTA according to the first embodiment is given in the following way using these equations (17), (18), (19), (20), and (21).

$$\Delta I = I_{D6} - I_{D5} = 4K\beta R_g i(V_{com} - V_{TH}) = 4K\sqrt{\beta I_o} R_g i \quad (22)$$

If the above-identified equation (8) is substituted into the equation (22), the differential output current $\Delta I$ is rewritten to the following equation (23).

$$\Delta I = 4K\sqrt{\beta I_o} R_g i = 4K\sqrt{\beta I_o} \frac{R_g}{R} V_i \quad (23)$$

It is seen from the equation (23) that the differential output current $\Delta I$ of the CMOS OTA according to the first embodiment varies linearly by changing the driving currents $I_0$ of the input-pair MOSFETs M1 and M2, and that the temperature dependence of the resistors 2 and 3 are canceled with each other.

With the tunable CMOS OTA according to the first embodiment, as described above, the transconductance is tunable by changing the driving currents $I_0$, which is realized without using any nonlinear components. Thus, the transconductance linearity of the tunable OTA is improved compared with the conventional tunable CMOS OTA in FIG. 1.

Moreover, the tunable CMOS OTA according to the first embodiment is basically comprised of the differential input pair, the source-degeneration resistor 1, the current sources 4 and 5 for the differential input pair, and the put circuit. Therefore, this OTA has a simple circuit configuration.

Additionally, the differential input pair of the MOSFETs M1 and M2 converts the applied differential input voltage $V_i$ to the current I flowing through the resistor 1 and then, generates the pair of differential output currents (I+i) and ($I_0$-i) The output circuit generates the bias voltages $V^+$ and $V^-$ from the pair of differential output currents ($I_0$+i) and ($I_0$-i), thereby generating the current I' flowing through the resistors 2 and 3 linearly proportional to the applied differential input voltage $V_i$.

Accordingly, the differential output current $\Delta I$ of the OTA according to the first embodiment includes no resistance dimension of the resistors 1, 2, and 3, which results in the fact that this tunable OTA has no temperature dependence due to these resistors 1, 2, and 3. This means that the temperature characteristic or temperature dependence itself is improved.

Figure 3:
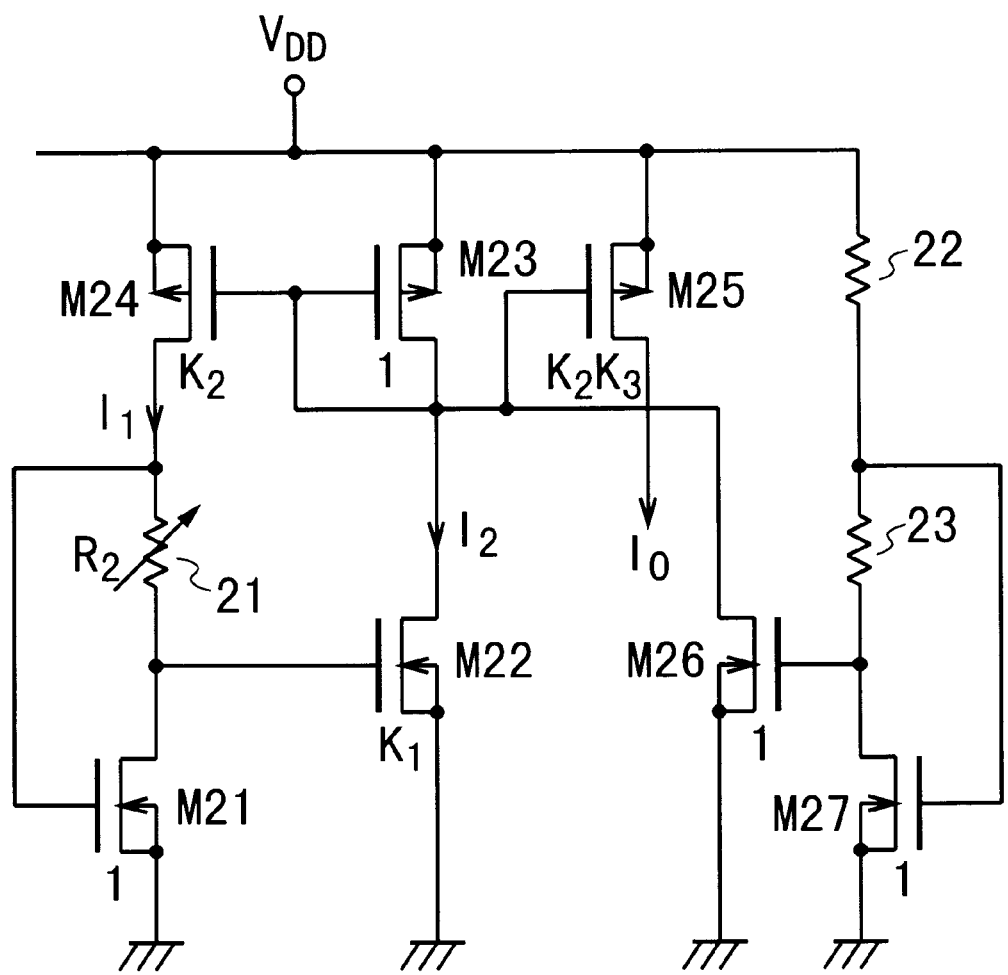
FIG. 3 is a circuit diagram of a CMOS self-biasing Nagata current reference circuit used for each current source or sink of the tunable CMOS OTA according to the present invention.

FIG. 3 shows a CMOS self-biasing Nagata current reference circuit used as each of the variable current sources 4 and 5 in the tunable CMOS OTA according to the first embodiment, which is disclosed in the Japanese Non-Examined Patent Publication No. 5-191166 published in 1993.

As shown in FIG. 3, the Nagata current reference circuit is basically comprised of two n-channel MOSFETs M21 and M22 and two p-channel MOSFETs M23 and M24.

A source of the MOSFET M21 is connected to the ground. A gate and a drain of the MOSFET M21 are coupled together through a variable resistor 21 with a variable resistance $R_2$. The drain of the MOSFET M21 is connected to a gate of the MOSFET M22. The gate of the MOSFET M21 is connected to a drain of the MOSFET M24. A source of the MOSFET M22 is connected to the ground. A drain of the MOSFET M22 is connected to a drain of the MOSFET M23.

The two MOSFETs M21 and M22 and the variable resistor 21 constitute a nonlinear current mirror circuit.

A source of the MOSFET M24 is connected to the power supply line of $V_{DD}$. A gate of the MOSFET M24 is connected to a gate of the MOSFET M23. A source of the MOSFET M23 is connected to the power supply line of $V_{DD}$. The gate and a drain of the MOSFET M23 are coupled together to be connected to the drain of the MOSFET M22.

The two MOSFETs M23 and M24 constitute a linear current mirror circuit, which serves to drive the nonlinear current mirror circuit of the MOSFETs M21 and M22 and the resistor 21.

The Nagata current reference circuit is further comprised of a p-channel MOSFET M25, two n-channel MOSFETs M26 and M27, and two resistors 22 and 23. The p-channel MOSFET M25 constitutes an output transistor. The n-channel MOSFETs M26 and M27 and the resistors 22 and 23 constitute a start-up circuit.

The n-channel MOSFETs M21, M26, and M27 have the same gate-width to gate-length ratio (W/L). The n-channel MOSFET M22 has the ratio (W/L) $K_1$ times as large as that of the n-channel MOSFETs M21, M26, and M27, where $K_1$ is a constant greater than unity (i.e., $K_1 > 1$).

The p-channel MOSFET M24 has the ratio (W/L) $K_2$ times as large as that of the p-channel MOSFET M23, where $K_2$ is a constant greater than unity (i.e., $K_2 > 1$). The p-channel MOSFET M25 has the ratio (W/L) $K_2 \cdot K_3$ times as large as that of the p-channel MOSFET M23, where $K_3$ is a constant greater than unity (i.e., $K_3 > 1$).

The operation of the Nagata current reference circuit shown in FIG. 3 is as follows.

When currents flowing through the MOSFETs M21 and M22 are defined as $I_1$ and $I_2$, and gate-to-source voltages thereof are defined as $V_{GS21}$ and $V_{GS22}$, respectively, the following equations (24) and (25) are established.

$$I_1 = \beta(V_{GS21} - V_{TH})^2 \qquad (24)$$

$$I_2 = K_1\beta(V_{GS22} - V_{TH})^2 \qquad (25)$$

Here, the following relationship (26) is established.

$$V_{GS22} V_{GS21} I_1 R_2 \qquad (26)$$

If the relationship (26) is substituted into the equation (25), the equation (25) is rewritten to the following equation (27).

$$I_2 K_1 \beta \{(V_{GS21} - V_{TH}) - I_1 R_2\}^2 \qquad (27)$$

By substituting the equation (24) into the equation (27), the current $I_2$ is expressed as the following equation (28).

$$I_2 = K_1 \beta \left( \sqrt{\frac{I_1}{\beta}} - I_1 R_2 \right)^2 \qquad (28)$$

$$= K_1 \beta \left\{ \sqrt{\frac{I_1}{\beta}} (1 - \sqrt{\beta I_1} R_2) \right\}^2$$

$$= K_1 I_1 (1 - \sqrt{\beta I_1} R_2)^2$$

The equation (28) is rewritten to the following equation (29).

$$\sqrt{\frac{I_2}{K_1 I_1}} = 1 - \sqrt{\beta I_1} R_2 \qquad (29)$$

Here, the following relationship (30) is established between the currents $I_1$ and $I_2$.

$$\frac{I_2}{I_1} = \frac{1}{K_2} \qquad (30)$$

Then, the current $I_2$ is canceled from the equation (29) using the relationship (30), resulting in the following equation (31).

$$I_1 = \frac{1}{\beta R_2^2}\left(1 - \frac{1}{\sqrt{K_1 K_2}}\right)^2 \qquad (31)$$

Here, the following relationship (32) is established between the currents $I_1$ and $I_0$.

$$I_0 K_3 I_1 \qquad (32)$$

Substituting the relationship (32) into the equation (31) gives the following equation (33).

$$I_o = K_3 I_1 \qquad (33)$$

$$= \frac{K_3}{\beta R_2^2}\left(1 - \frac{1}{\sqrt{K_1 K_2}}\right)^2$$

Accordingly, by substituting the equation (33) thus obtained into the above equation (23), the differential output current ΔI of the CMOS OTA according to the first embodiment is expressed in the following way.

$$\Delta I = 4K\sqrt{K_3}\left(1 - \frac{1}{\sqrt{K_1 K_2}}\right)\frac{R_g}{R_2 R}V_i \qquad (34)$$

As seen from the equation (34), the transconductance parameter β (i.e., the effective mobility of carriers) having a negative temperature coefficient is eliminated in the differential output current ΔI of the CMOS OTA, where the transconductance parameter β is inversely proportional to absolute temperature T (i.e., $T^{1.5}$).

Thus, the transconductance of the OTA according to the first embodiment in FIG. 2 is tunable by changing the resistance $R_2$ of the resistor 21 while the other performance is kept unchanged.

Also, since the temperature coefficients of the drain currents $I_{D5}$ and $I_{D6}$ of the MOSFETs M5 and Me are canceled with each other, the differential output current ΔI is affected by only the temperature dependence of the resistance $R_2$ of the source-degeneration resistor 1. If the resistor 1 is formed by an external variable resistor, the temperature dependence of the resistor 1 is able to be minimized. As a result, the temperature dependence of the differential output current ΔI can be decreased to approximately zero.

SECOND EMBODIMENT

Figure 4:
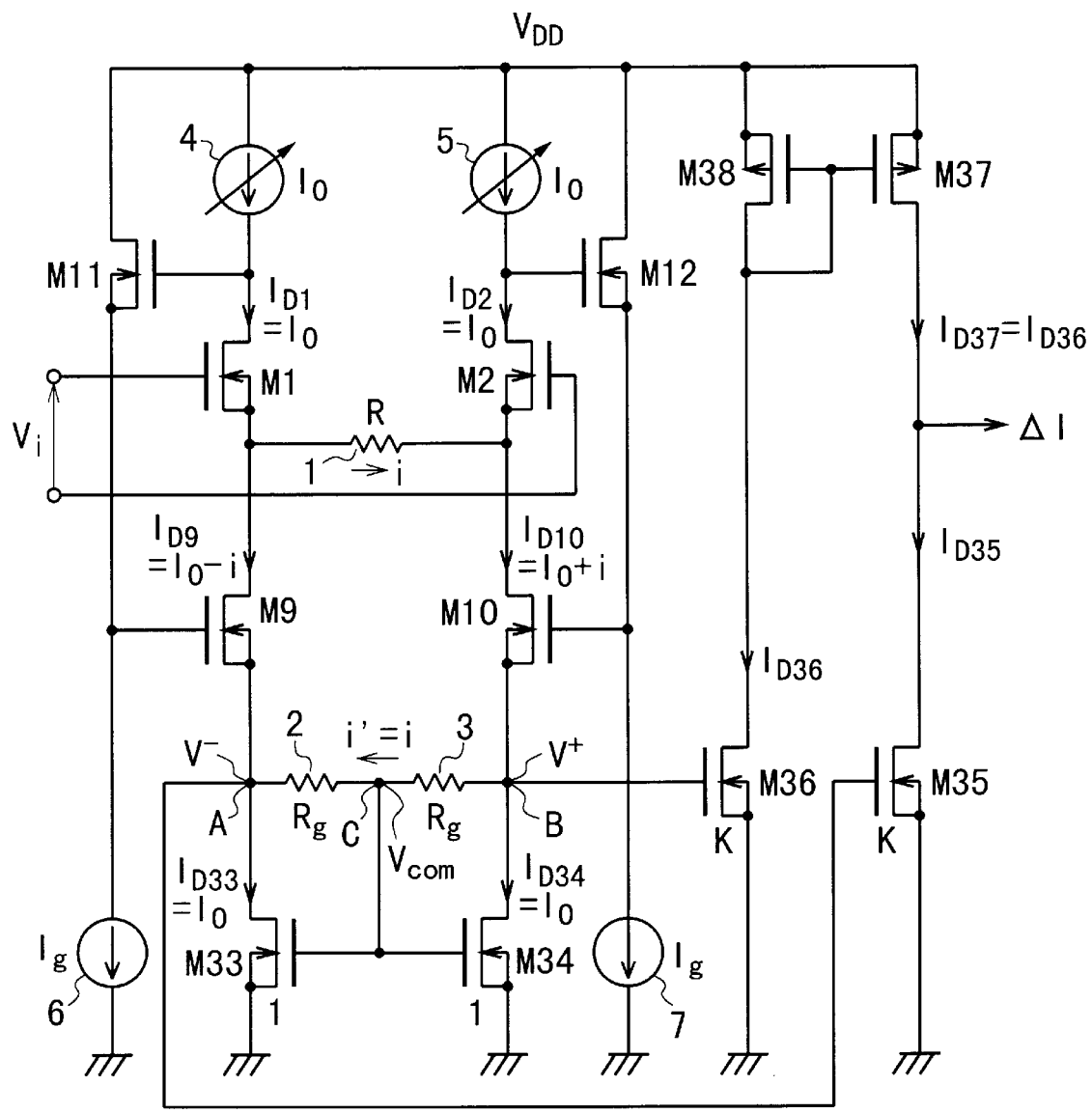
FIG. 4 is a circuit diagram of a tunable CMOS OTA according to a second embodiment of the present invention.

FIG. 4 shows a tunable CMOS OTA according to a second embodiment of the present invention, which includes approximately the same circuit configuration as that of the first embodiment. Therefore, the explanation about the same configuration is omitted here for the sake of simplification of description by adding the same reference numerals and characters to the same or corresponding elements in FIG. 4.

The OTA according to the second embodiment has the following difference from the first embodiment.

Instead of the p-channel MOSFETs M3, M4, M5, and M6 in the first embodiment, n-channel MOSFETs M33, M34, M35, and M36 are provided in the second embodiment, respectively. Instead of the n-channel MOSFETs M7 and M8 in the first embodiment, p-channel MOSFETs M37 and M38 are provided in the second embodiment, respectively. The n-channel MOSFETs M13 and M14 in the first embodiment are removed.

Although the output circuit is connected to the V-I converter circuit in parallel in the first embodiment, the output circuit is connected to the V-I converter circuit in series in the second embodiment.

As shown in FIG. 4, the resistors 2 and 3 are directly connected to the sources of the MOSFETs M9 and M10 at the points A and B, respectively. Drains of the n-channel MOSFETs M33 and M34 are directly connected to the sources of the MOSFETs M9 and M10 at the points A and B, respectively. Gates of the MOSFETs M33 and M34 are coupled together to be connected to the resistors 2 and 3 at the point C. Sources of the MOSFETs M33 and M34 are connected to the ground.

The points A and B are connected to gates of the n-channel MOSFETs M35 and M36, respectively. Sources of the MOSFETs M35 and M36 are connected to the ground. Drains of the MOSFETs M33 and M34 are connected to drains of the p-channel MOSFETs M37 and M38, respectively. Sources of the MOSFETs M37 and M38 are connected to the power supply line of $V_{DD}$. Gates of the MOSFETs M37 and M38 are coupled together. The gate and drain of the MOSFET M38 are coupled together. The differential output current $\Delta I$ of the CMOS OTA according to the second embodiment is derived from the drain of the MOSFET M35.

The n-channel MOSFETs M33 and M34 have the same gate-width to gate-length ratio (W/L). The n-channel MOSFETs M35 and M36 have the ratio (W/L) K times as large as that of the MOSFETs M33 and M34. The p-channel MOSFETs M37 and M38 have the same gate-width to gate-length ratio (W/L).

It is needless to say that the operation principle of the OTA according to the second embodiment is the same as that of the first embodiment, and that the OTA according to the second embodiment has the same advantages as those in the first embodiment.

The OTA according to the second embodiment has an additional advantage that the current consumption is lowered compared with OTA according to the first embodiment.

In the above first and second embodiments, a CMOS self-biasing Nagata current reference circuit is used as each of the variable current sources 4 and 5. However, any other current reference circuit may be used therefor, an example of which is a CMOS self-biasing Widlar current reference circuit.

Figure 5:
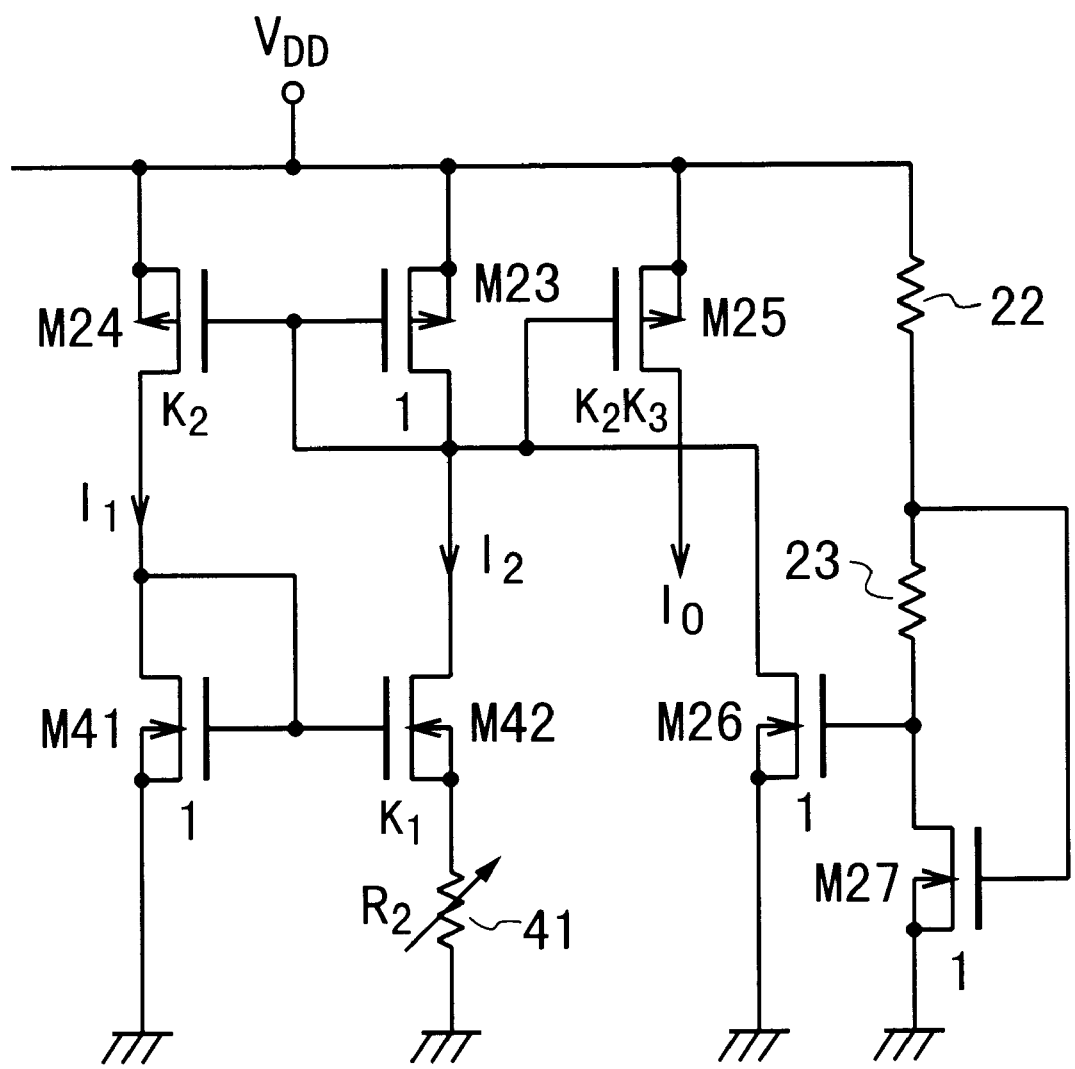
FIG. 5 is a circuit diagram of a CMOS self-biasing Widlar current reference circuit used for each current source or sink of the tunable CMOS OTA according to the present invention.

FIG. 5 shows the circuit configuration of the CMOS self-biasing Widlar current reference circuit.

As seen from FIG. 5, this CMOS self-biasing Widlar current reference circuit includes a similar circuit configuration to that of the Nagata current reference circuit shown in FIG. 3. Therefore, the explanation about the same configuration is omitted here for the sake of simplification of description by adding the same reference numerals and characters to the same or corresponding elements in FIG. 5.

In the Widlar current reference circuit shown in FIG. 5, a drain and a gate of an n-channel MOSFET M41 are directly coupled together to be connected to the drain of the MOS-FET M24. A source of the MOSFET H41 is connected to the ground. A gate of the n-channel MOSFET M42 is connected to the coupled gate and drain of the MOSFET M41. A drain of the MOSFET M42 is connected to the drain and gate of the MOSFET M23. A source of the MOSFET M42 is connected to the ground through a variable resistor 41 with a variable resistance $R_2$. The other configuration is the same as the Nagata current reference circuit of FIG. 3.

The n-channel MOSFETs M41, M26, and M27 have the same gate-width to gate-length ratio (W/L) The n-channel MOSFET M42 has the ratio (W/L) $K_1$ times as large as that of the n-channel MOSFETs M41, M26, and M27.

The operation of the Widlar current reference circuit is as follows.

When currents flowing through the MOSFETs M41 and M42 are defined as $I_1$ and $I_2$, and gate-to-source voltages thereof are defined as $V_{GS41}$ and $V_{GS42}$, respectively, the following equations (35) and (36) are established.

$$I_1 = \beta(V_{GS41} - V_{TH})^2 \tag{35}$$

$$I_2 = K_1\beta(V_{GS42} - V_{TH})^2 \tag{36}$$

Here, the following relationship (37) is established.

$$V_{GS41} V_{GS42} I_2 R_2 \tag{37}$$

If the relationship (37) is substituted into the equation (36), the equation (36) is rewritten to the following equation (38).

$$I_2 K_1 \beta \{(V_{GS41} - V_{TH}) - I_2 R_2\}^2 \tag{38}$$

By substituting the equation (35) into the equation (38), the current $I_2$ is expressed as the following equation (39).

$$I_2 = K_1 \beta \left( \sqrt{\frac{I_1}{\beta}} - K_1 I_1 R_2 \right)^2 \tag{39}$$

$$= K_1 \beta \left\{ \sqrt{\frac{I_1}{\beta}} \left(1 - \sqrt{\beta I_1}\, K_1 R_2 \right) \right\}^2$$

$$= K_1 I_1 \left(1 - \sqrt{\beta I_1}\, K_1 R_2 \right)^2$$

The equation (39) is rewritten to the following equation (40).

$$\sqrt{\frac{I_2}{K_1 I_1}} = 1 - \sqrt{\beta I_1}\, K_1 R_2 \tag{40}$$

Here, the following relationship (41) is established between the currents $I_1$ and $I_2$.

$$\frac{I_2}{I_1} = \frac{1}{K_2} \tag{41}$$

Then, the current $I_2$ is canceled from the equation (40) using the relationship (41), resulting in the following equation (42).

$$I_1 = \frac{1}{\beta K_1^2 R_2^2} \left(1 - \frac{1}{\sqrt{K_1 K_2}}\right)^2 \tag{42}$$

Here, the following relationship (43) is established between the currents $I_1$ and $I_0$.

$$I_0 = K_3 I_1 \tag{43}$$

By substituting the relationship (43) into the equation (42), the following equation (44) is obtained.

$$I_0 = \frac{K_3}{\beta K_1^2 R_2^2}\left(1 - \frac{1}{\sqrt{K_1 K_2}}\right)^2 \tag{44}$$

Accordingly, the differential output current $\Delta I$ of the CMOS OTA according to the first embodiment is expressed in the following way using the equation (44) thus obtained.

$$\Delta I = \frac{K\sqrt{K_3}}{K_1}\left(1 - \frac{1}{\sqrt{K_1 K_2}}\right)\frac{R_g}{R_2 R} V_i \tag{45}$$

This equation (44) corresponds to the above equation (34) obtained in the Nagata current reference circuit.

Thus, it is found that the transconductance of the OTA according to the first and second embodiments in FIGS. 2 and 4 is tunable by changing the resistance $R_2$ of the resistor 41 in the Widlar current reference circuit shown in FIG. 5 while the other performance is kept unchanged.

In the above-described first and second embodiments, the CMOS self-biasing Nagata or Widlar current reference circuit is used. However, it is needless to say that any other current reference circuit may be used as each of the current sources 4 and 5 it is able to supply (or, sink) the variable driving current $I_0$ to (or, from) the differential input pair serving as a V-I converter.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A tunable CMOS OTA comprising:
    (a) a differential input pair of first and second MOSFETs;
        a differential input voltage being applied across gates of said first and second MOSFETs to generate a first pair of differential output currents;
        one of said first pair of differential output currents including a sum of a driving current and a current flowing through a first resistor;
        the other of said first pair of differential output currents including a difference of said driving current and said current flowing through said first resistor;
        said current flowing through said first resistor being linearly proportional to said applied differential input voltage;
    (b) said first resistor connected to sources of said first and second MOSFETs;
    (c) a current source/sink for supplying/sinking a variable driving current to said differential input pair;
    (d) an output circuit for said differential input pair;
        said output circuit including third and fourth MOSFETs whose gates are coupled together to be connected to a connection point, a second resistor connected to a drain of said third MOSFET and said connection point, a third resistor connected to a drain of said fourth MOSFET and said connection point, a fifth MOSFET whose gate is connected to said drain of said third MOSFET, and a sixth MOSFET whose gate is connected to said drain of said fourth MOSFET;
    wherein said first pair of differential output currents of said differential input pair are applied to said drains of said third and fourth MOSFETs, respectively, thereby generating a first bias voltage at said drain of said third MOSFET and a second bias voltage at said drain of said fourth MOSFET;
    and wherein said first and second bias voltages generate a current flowing through said second and third resistors and a second pair of differential output currents flowing through said fifth and sixth MOSFETs, respectively; said current flowing through said second and third resistors being linearly proportional to said applied differential input voltage;
    and wherein a differential output current of the OTA is derived from a difference between said second pair of differential output currents, and a transconductance of the OTA is tunable by changing said driving current supplied/sunk by said current source/sink.

2. The OTA according to claim 1, further comprising a current mirror circuit provided between said differential input pair and said output circuit
    wherein said first pair of output currents of said differential input pair are applied to said output circuit through said current mirror circuit.

3. The OTA according to claim 2, wherein said current mirror circuit is a source-follower-augmented current mirror circuit.

4. The OTA according to claim 1, wherein said current source/sink for supplying/sinking said variable driving current to said differential input pair is formed by a current reference circuit capable of generation of a variable reference current including no transconductance parameter.

5. The OTA according to claim 1, wherein said output circuit includes a current mirror circuit;
    and wherein said second pair of differential output currents are derived through said current mirror circuit, thereby generating said differential output current of the OTA.

6. The OTA according to claim 1, wherein said first and second MOSFETs have a first conductivity type and said third to sixth MOSFETs have a second conductivity type opposite to said first conductivity type;
    and wherein said differential input pair and said output circuit are connected in parallel.

7. The OTA according to claim 1, wherein said first to sixth MOSFETs have a same conductivity type;
    and wherein said differential input pair and said output circuit are connected in series.

* * * * *

UNITED STATES PATENT AND TRADEMARK OFFICE
CERTIFICATE OF CORRECTION

PATENT NO. : 5,999,055
DATED : December 7, 1999
INVENTOR(S) : Katsuji Kimura

It is certified that error appears in the above-identified patent and that said Letters Patent is hereby corrected as shown below:

Column 3,
Line 34, delete "V" and insert therefor --$V_i$--;
Line 53, delete "$2B(V_{con}-V_{GS138} - V_{TH}) | V_i |$" and insert therefor --$2B(V_{con} - V_R - V_{GS138} - V_{TH}) | V_i |$ --

Column 7,
Line 4, delete "X9" and insert therefor --M9--;
Line 5, delete "M1" and insert therefor --M11--.

Column 8,
Line 54, delete "$I_{D9} I_0 i$" and insert therefor --$I_{D9} = 10_o - i$--.

Column 9,
Line 14, delete "ME" and insert therefor --M8--;
Line 20, delete "$I_{D3} = I_{D14} - i^1 = I_0 i - i^1$" and insert therefor
    --$I_{D4} = I_{D13} - i = I_0 - i + i^1$--;
Line 22, delete "$I_{D4} + I_{D13} - i^1 = I_0 I + i^1$" and insert therefor
    --$I_{D4} = I_{D13} - i = I_0 - I + i^1$--;
Line 33, delete ""$I_{D3} I_{D4}$" and insert therefore --$I_{D3} = I_{D4}$--;
Line 59, delete "(18)" and insert therefor --(17)--.

Column 10,
Line 34, delete "(I + i)" and insert therefor --($I_o$ + i)--.

Column 11,
Line 40, delete $V_{GS22}$ $V_{GS21} I_1 R_2$" and insert therefor --$V_{GS22} = V_{GS21} - I_1 R_2$--;
Line 46, delete "$I_2 K_1 B$" and insert therefor --$I_2 = K_1 B$--.

Column 12,
Line 19, delete "$I_0 K_3 I_1$" and insert therefor --$I_0 = K_3 I_1$--;
Line 49, delete "Me" and insert therefor --M6--.

UNITED STATES PATENT AND TRADEMARK OFFICE
CERTIFICATE OF CORRECTION

PATENT NO.    : 5,999,055
DATED         : December 7, 1999
INVENTOR(S)   : Katsuji Kimura It is certified that error appears in the above-identified patent and that said Letters Patent is hereby corrected as shown below:

<u>Column 14</u>,
Line 1, delete "H41" and insert therefor --M41--;
Line 26, delete $V_{GS41}$ $V_{GS42}$ $I_2R_2$" and insert therefor --$V_{GS41} = V_{GS42} + I_2R_2$--;
Line 33, delete "$I_2K_1B$" and insert therefor --$I_2 = K_1B$--.

Signed and Sealed this

Tenth Day of July, 2001

*Attest:*

NICHOLAS P. GODICI
*Attesting Officer*   *Acting Director of the United States Patent and Trademark Office*

UNITED STATES PATENT AND TRADEMARK OFFICE
CERTIFICATE OF CORRECTION

PATENT NO. : 5,999,055
DATED : December 7, 1999
INVENTOR(S) : Katsuji Kimura

Page 1 of 1

It is certified that error appears in the above-identified patent and that said Letters Patent is hereby corrected as shown below:

Column 8,
Line 54, delete [$I_{D9}I_0i$] and insert therefor --$I_{D9}=I_0$-i --

Column 9,
Line 22, delete [$I_{D4}=I_{D13}\text{-i}=I_0\text{i}+i^1$] and insert therefor -- $I_{D4}\text{-}I_{D13}\text{-i}=I_0\text{-iti}^1$ --

Signed and Sealed this

Eleventh Day of December, 2001

Attest:

NICHOLAS P. GODICI
Attesting Officer   Acting Director of the United States Patent and Trademark Office